US 12,404,600 B2

United States Patent
Cohen et al.

(10) Patent No.: US 12,404,600 B2
(45) Date of Patent: Sep. 2, 2025

(54) FINS ON CRUCIBLE OR GUSSETS ON REFRACTORY LINING FOR FACILITATING EXCLUSION OF IMPURITIES FROM A BOULE

(71) Applicant: Siemens Medical Solutions USA, Inc., Malvern, PA (US)

(72) Inventors: Peter Cohen, Knoxville, TN (US); Troy Marlar, Knoxville, TN (US); Mark Andreaco, Knoxville, TN (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 0 days.

(21) Appl. No.: 18/326,342

(22) Filed: May 31, 2023

(65) Prior Publication Data
US 2024/0401227 A1   Dec. 5, 2024

(51) Int. Cl.
C30B 15/10   (2006.01)
C30B 15/14   (2006.01)
C30B 29/16   (2006.01)

(52) U.S. Cl.
CPC .............. *C30B 15/10* (2013.01); *C30B 15/14* (2013.01); *C30B 29/16* (2013.01); *Y10T 117/1016* (2015.01); *Y10T 117/1032* (2015.01)

(58) Field of Classification Search
CPC .......... C30B 15/10; C30B 15/14; C30B 29/16
See application file for complete search history.

(56) References Cited

U.S. PATENT DOCUMENTS

| | | | |
|---|---|---|---|
| 5,292,487 A * | 3/1994 | Tatsumi | C30B 15/14 117/936 |
| 5,690,731 A | 11/1997 | Kurata et al. | |
| 2006/0124052 A1 | 6/2006 | Harada et al. | |
| 2015/0211147 A1* | 7/2015 | Masaki | C30B 29/36 117/213 |

FOREIGN PATENT DOCUMENTS

| | | |
|---|---|---|
| CN | 109518276 | 3/2019 |
| CN | 112011825 | 12/2020 |
| JP | 3873568 | 1/2007 |
| JP | 2010173929 A * | 8/2010 |
| KR | 20200041166 A * | 4/2010 |
| WO | WO-2021044907 A1 * | 3/2021 |

OTHER PUBLICATIONS

International Search Report for Corresponding Application No. PCT/US2024/016987, mailed Aug. 14, 2024.

* cited by examiner

*Primary Examiner* — Hua Qi

(57) ABSTRACT

A furnace and a method of growing a high temperature oxide crystal in the furnace. The furnace includes a crucible having a melt therein and a heating element for generating heat in the melt. A thermal element within the furnace produces a thermal gradient within the melt to draw a cold spot of a convection cell of the melt away from a seed location of the crucible. A seed crystal is drawn from the melt at the seed location to form a boule to grow the high temperature oxide crystal.

7 Claims, 6 Drawing Sheets

FINS ON CRUCIBLE OR GUSSETS ON REFRACTORY LINING FOR FACILITATING EXCLUSION OF IMPURITIES FROM A BOULE

BACKGROUND OF THE INVENTION

Field of the Invention

The present invention relates generally to crystal growth and in particular relates to methods for reducing impurities in high temperature oxide crystals grown for scintillation detectors used in Positron Emission Tomography (PET).

Description of the Related Art

In manufacturing a boule of Lutetium Oxyorthosciilicate (LSO), Lutetium Yttrium Oxyorthosciilicate (LYSO) or Gadolinium Aluminium Gallium Garnets (GAGG) type scintillators, powders are added to a crucible in an appropriate stoichiometric ratio and heated to form a melt. A seed crystal is then lowered to contact the melt and gradually drawn away from the melt to form the boule. It is desirable for any dopants in the melt to be evenly distributed as the boule is drawn so that the distribution of the dopants in the boule is uniform. It is also desirable for impurities to not be incorporated in the boule.

However, this is typically not the case. Due to the geometrical symmetry of the furnace and the thermal field it produces, a symmetrical flow field of the melt produces a cold spot in the center of the crucible, creating a location at which impurities can collect. Since the seed crystal contacts the melt in the center (i.e., at the cold spot), the impurities tend to become incorporated into the boule. It is therefore desirable to create a flow field in the crucible that moves impurities away from a location at which a seed crystal contacts the melt.

BRIEF SUMMARY OF THE INVENTION

Disclosed herein is a method of growing a high temperature oxide crystal; wherein the method includes disposing a melt within a crucible, the crucible including at least one thermal element, heating the melt within the crucible, wherein the at least one thermal extension produces a thermal gradient within the melt to draw a cold spot of a convection cell of the melt away from a seed location of the crucible, and drawing a boule from the seed location of the crucible to grow the high temperature oxide crystal.

Disclosed herein also is a furnace for growing a high temperature oxide crystal; the furnace including a crucible having a melt therein, a heating element for generating heat in the melt, a thermal element within the furnace that produce a thermal gradient within the melt to draw a cold spot of a convection cell of the melt away from a seed location of the crucible, and a seed crystal for drawing a boule from the melt at the seed location to grow the high temperature oxide crystal.

BRIEF DESCRIPTION OF THE DRAWINGS

These and other features, aspects, and advantages of the present invention will become better understood with reference to the following description and appended claims, and accompanying drawings where:

Figure 1:
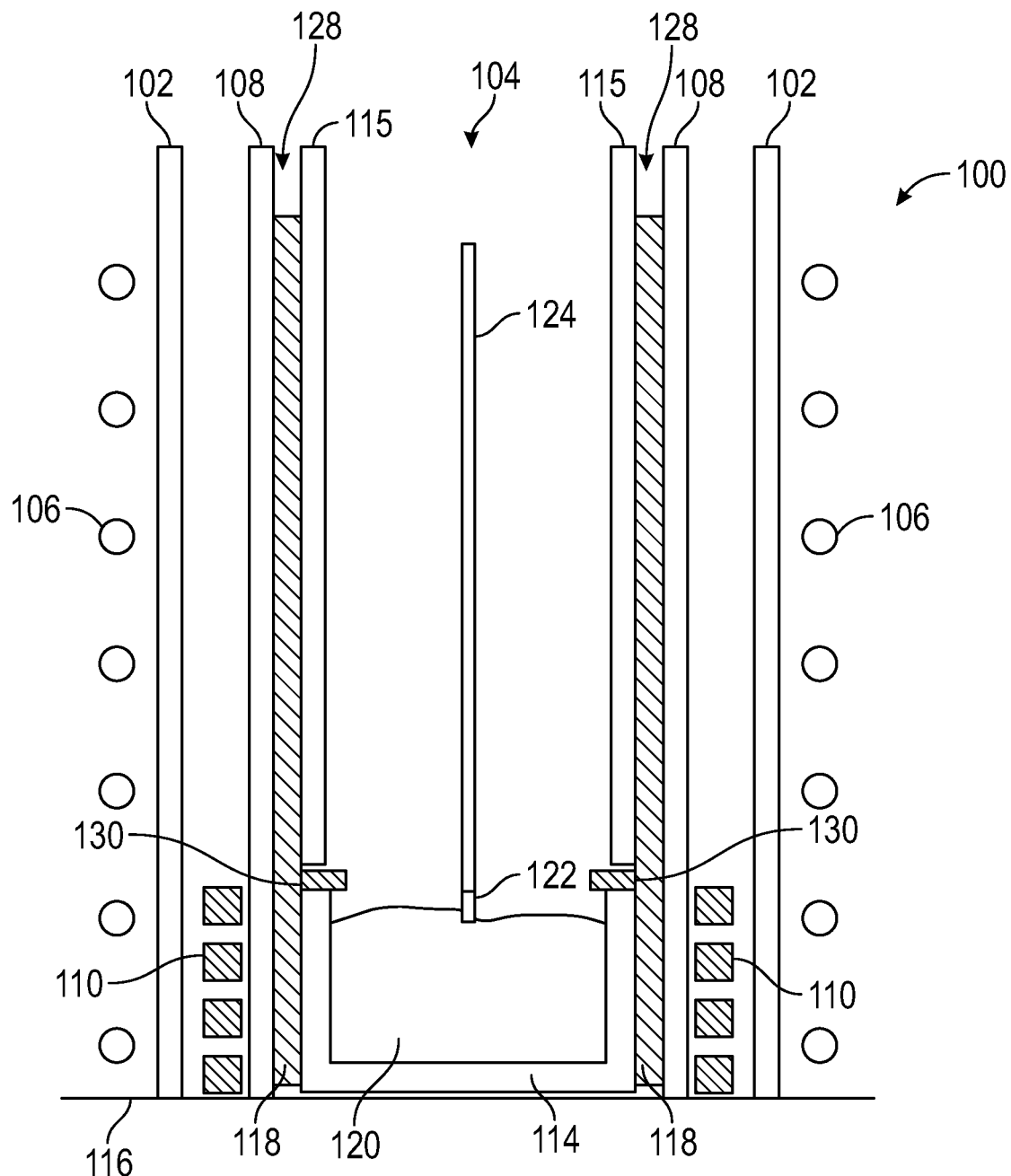
FIG. 1 is a side view of a furnace in which a boule is grown, in an illustrative embodiment.

It should be understood that the various embodiments are not limited to the arrangements and instrumentality shown in the drawings.

DETAILED DESCRIPTION OF THE INVENTION

The present invention may be understood more readily by reference to the following detailed description of preferred embodiments of the invention as well as to the examples included therein. All numeric values are herein assumed to be modified by the term "about," whether or not explicitly indicated. The term "about" generally refers to a range of numbers that one of skill in the art would consider equivalent to the recited value (i.e., having the same function or result). In many instances, the term "about" may include numbers that are rounded to the nearest significant figure.

FIG. 1 is a side view of a furnace 100 in which a boule is grown, in an illustrative embodiment. The furnace 100 includes a furnace wall 102 enclosing a space 104. A copper coil 106 is wrapped around an outer surface of the furnace wall 102. Water or coolant flows through the copper coil 106 to carry heat away from the furnace 100 or maintain a temperature in the space 104 within the furnace 100. A quartz tube 108 is disposed concentrically within the furnace wall 102. An induction coil 110 disposed is in an annulus between the quartz tube 108 and the furnace wall 102. A crucible 114 is placed at a bottom surface 116 of the furnace 100 within the quartz tube 108. The crucible 114 includes a right cylindrical wall extending upward from a bottom crucible surface. The crucible 114 can be made of iridium. The crucible 114 extends partway up the furnace 100 from the bottom surface 116. A brick cylinder or ceramic cylinder 115 extends from a top of the crucible 114 to a top or lid 130 of the furnace 100. A thermal filler 118 is disposed in an annulus 128 between the quartz tube 108 and the crucible 114/brick cylinder 115.

To make a boule, ingredients for forming a melt 120 are disposed in the crucible 114 and the crucible 114 is placed concentrically within the furnace 100. The induction coil 110 is activated to heat the ingredients to form the melt 120. A seed crystal 122 is lowered through the brick cylinder 115 at an end of a rod 124 to contact a top of the melt 120 at a seed location (i.e., a location at which the boule is to be drawn from the melt). The seed crystal 122 is then drawn upward (with accompanying rotary motion) from the melt 120, allowing the melt 120 to cool and crystallize around the seed crystal 122. Drawing the seed crystal 122 upward therefore creates a boule or cylindrical crystal.

Figure 2:
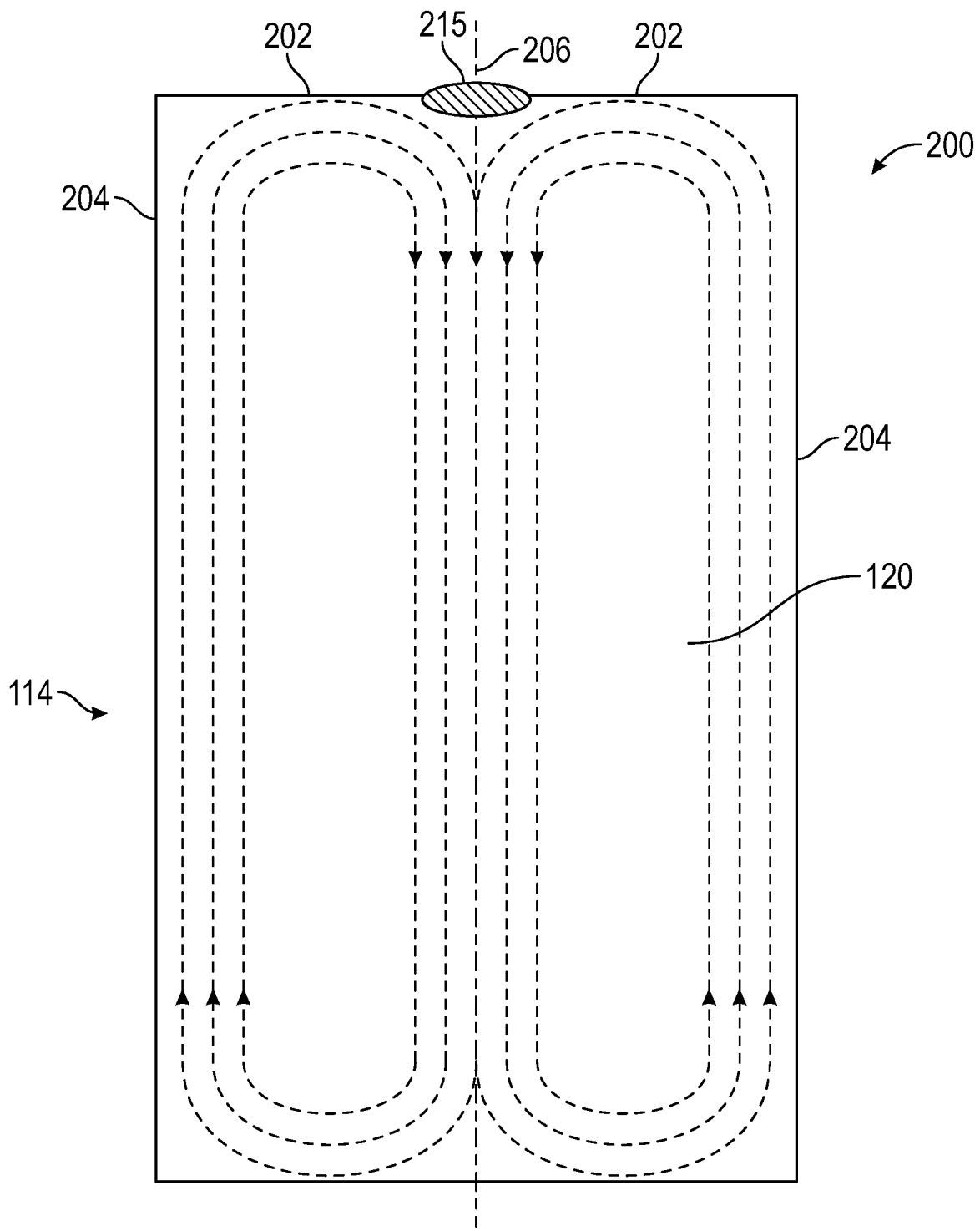
FIG. 2 shows a side view of a crucible in the furnace during a heating of the melt.

FIG. 2 shows a side view 200 of the crucible during a heating of the melt. Convection cells 202 form in the melt 120 when the melt heated above a given temperature. The heat at the wall 204 of the crucible 114 causes the melt 120 to flow upward at the wall 204. Upon reaching the top of the crucible 114, the melt 120 migrates radially inward toward a central axis 206 of the crucible 114, cooling in the process. A cold spot 215 thus develops at the top of the melt at the central axis 206. Impurities will tend to collect at the cold spot 215. The melt 120 then descends to the bottom of the crucible 114 along the central axis 206. The method disclosed herein creates a thermal gradient in the melt to move the cold spot 215 away from the central axis 206.

Figure 3:
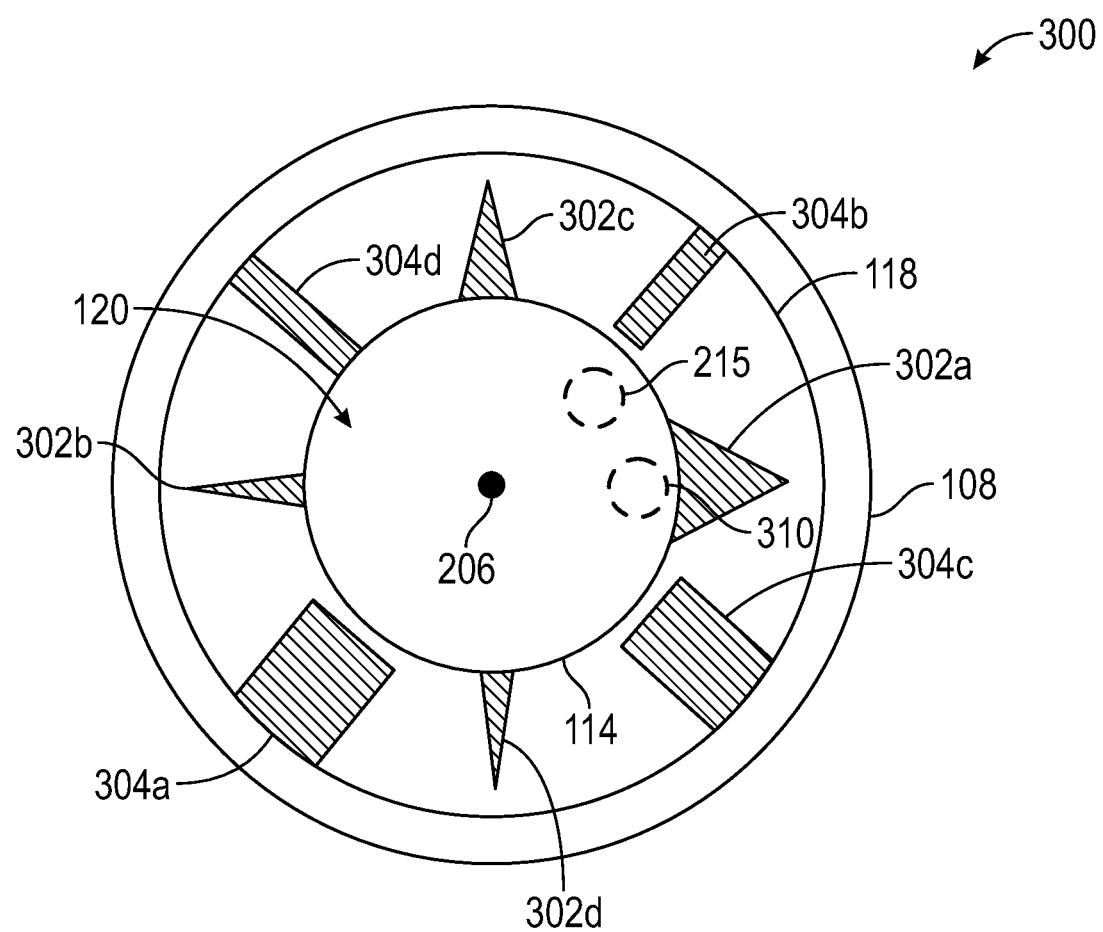
FIG. 3 shows a top view of the furnace depicting thermal elements used to produce a thermal gradient in the crucible.

FIG. 3 shows a top view 300 of the furnace depicting thermal elements used to produce a thermal gradient in the crucible 114 and thus throughout the melt 120 within the crucible 114. The crucible 114 includes at least one thermal element, such as a fin 302, on an its outer surface. For illustrative purposes, four fins 302a-d are shown on the outer surface of the crucible 114, separated from each other by 90 degrees. However, in various embodiments, any number of fins, including only one fin, can be formed on the crucible 114 and the spacing can be fins can be any amount and the fins need not be equally spaced. Referring to fin 302a for illustrative purposes, fin 302a is in contact with the crucible 114 at a selected location of the outer surface of the crucible 114. The fin 302a radiates heat away from the crucible and thus lowers a local temperature of the melt 120 at a location 310 inside the crucible 114 that is proximate the location at which the fin 302a is in contact with the crucible 114. The amount by which the local temperature is lowered is related to a thermal resistance of the fin which is based on a size of the fin, a material of the fin, a shape of the fin, etc. As shown in FIG. 3, the fins 302a-d can have different thermal resistances, i.e., different sizes, material, shapes, etc. For example, the first fin 302a can have a first thermal resistance and the second fin 302b can have a second thermal resistance different from the first thermal resistance. The design and placement of the fins 302a-d can be selected to create a thermal gradient that causes the cold spot to migrate to a selected location away from the central axis 206 of the crucible 114.

In another embodiment, the thermal filler 118 between the quartz tube 108 and the crucible 114 can include a thermal element, such as one or more ceramic gussets 304a-d extending inward from an outer surface 306. The size, shape and material of the one or more gussets 304a-d affects local temperatures within the melt and therefore the formation of a thermal gradient within the melt. For example, the first gusset 304a can have a first thermal resistance and the second gusset 304b can have a second thermal resistance different from the first thermal resistance. The gussets 304a-d radiate heat asymmetrically into the crucible, thereby affect the location of the cold spot 215. In various embodiments, both fins 302a-d and gussets 304a-d can be used together to create the thermal gradient within the melt 120.

Figure 4:
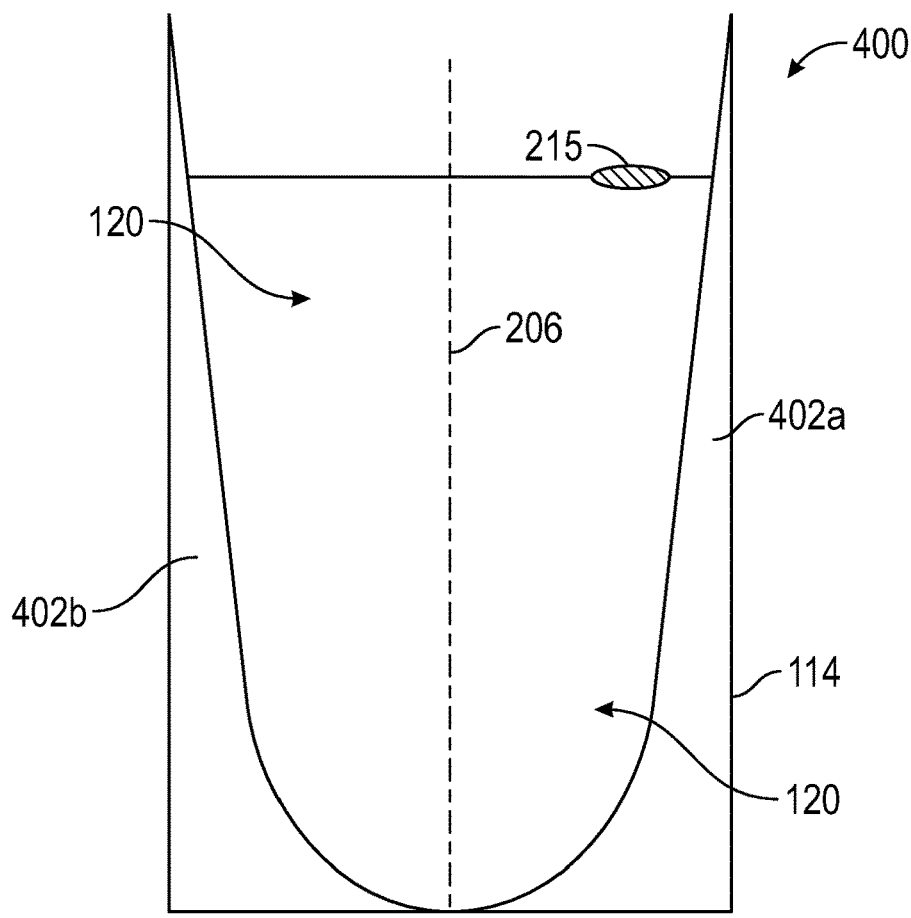
FIG. 4 shows a side view of the crucible, in another embodiment.

FIG. 4 shows a side view 400 of the crucible 114, in another embodiment. The crucible 114 includes a thermal element such as one or more baffles 402a, 402b extending radially inward from the walls of the crucible 114. The baffles 402a, 402b redirect a flow of the melt 120 within the crucible 114 away from the standard convection cell shown in FIG. 2. The transverse cross-section of the first baffle 402a is thicker than transverse the cross-section of the second baffle 402b. As a result of this difference, the first baffle causes greater heating than the second baffle, causing a thermal gradient in the direction between the first baffle and the second baffle, thereby facilitating the formation of an asymmetric convective flow that moves the location of the cold spot 125 away from a central axis 206 of the crucible 114.

Figure 5:
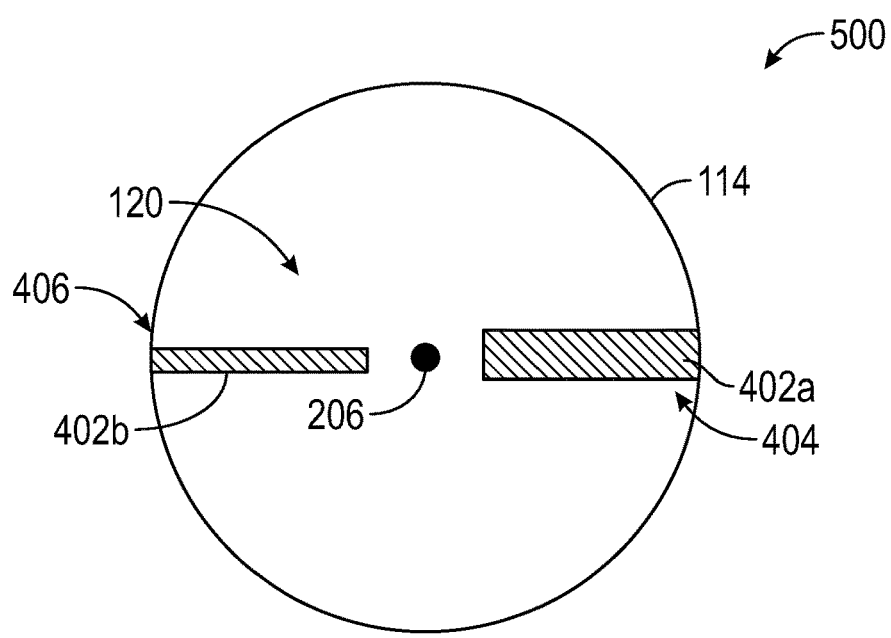
FIG. 5 shows a top view of a crucible shown in FIG. 4.

FIG. 5 shows a top view 500 of the crucible 114 shown in FIG. 4. The baffles 402a, 402b extends vertically parallel to the central axis 206 along the inner wall of the crucible 114. Each baffle 402a, 402b projects radially inward from the inner surface of the wall. The amount by which the baffles project inward varies with depth. The amount of inward projection is greatest at the bottom of the crucible 114 and decreases with height in the crucible 114 until they are flush or almost flush with the inner wall at the top of crucible 114. As a result of this configuration, the baffles 402a, 402b are more intrusive in the convection flow cells at the bottom of the crucible 114, thereby creating more stirring to occur at the bottom of the melt 120 than at the top of the melt 120. This stirring, as well as the asymmetric heating, affects the shape of the convection cell and thus the location of the cold spot 215 as seen in the FIG. 4.

Figure 6:
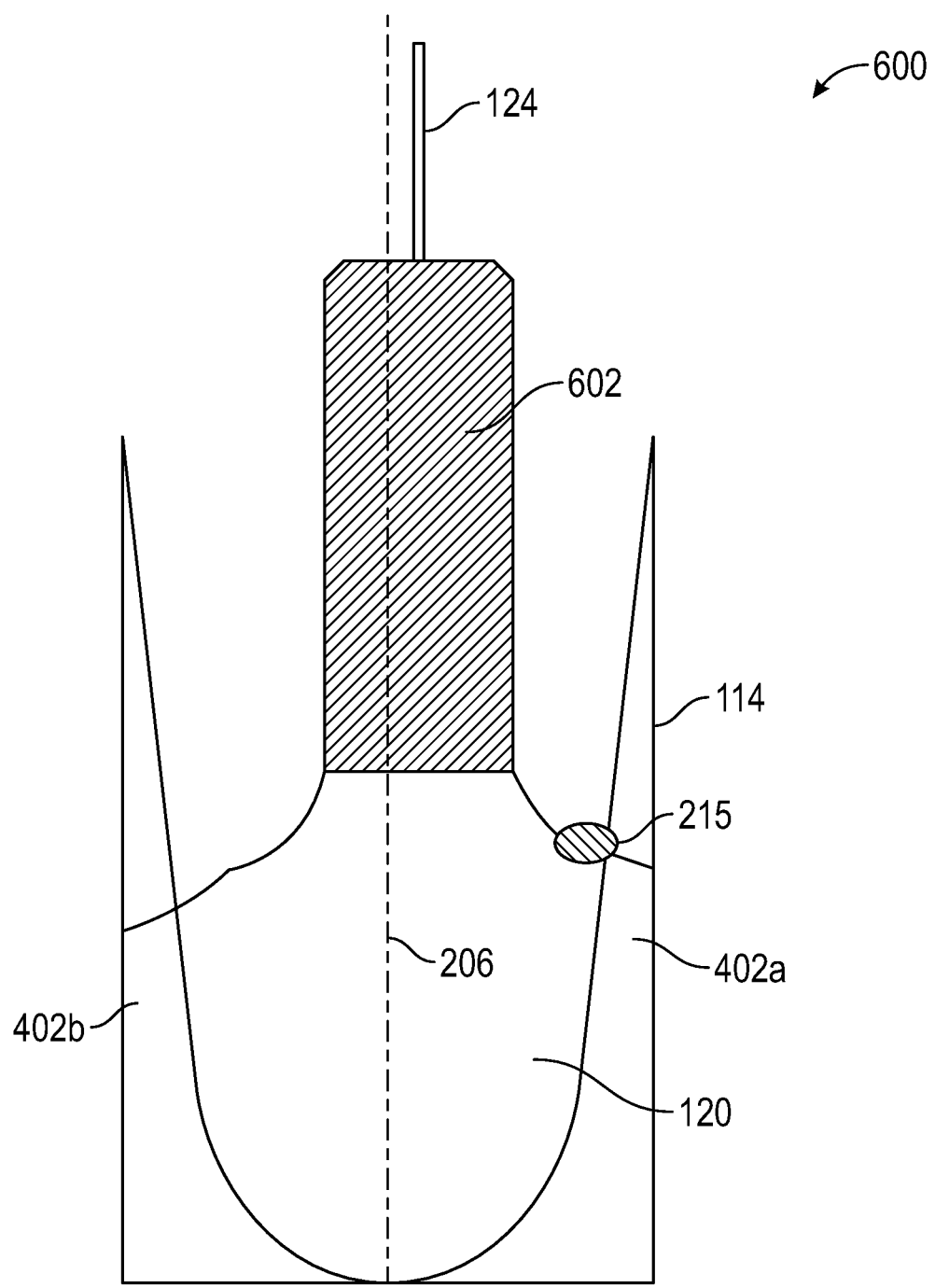
FIG. 6 shows a side view of the crucible of FIG. 5 during a formation of a boule.
Figure 7:
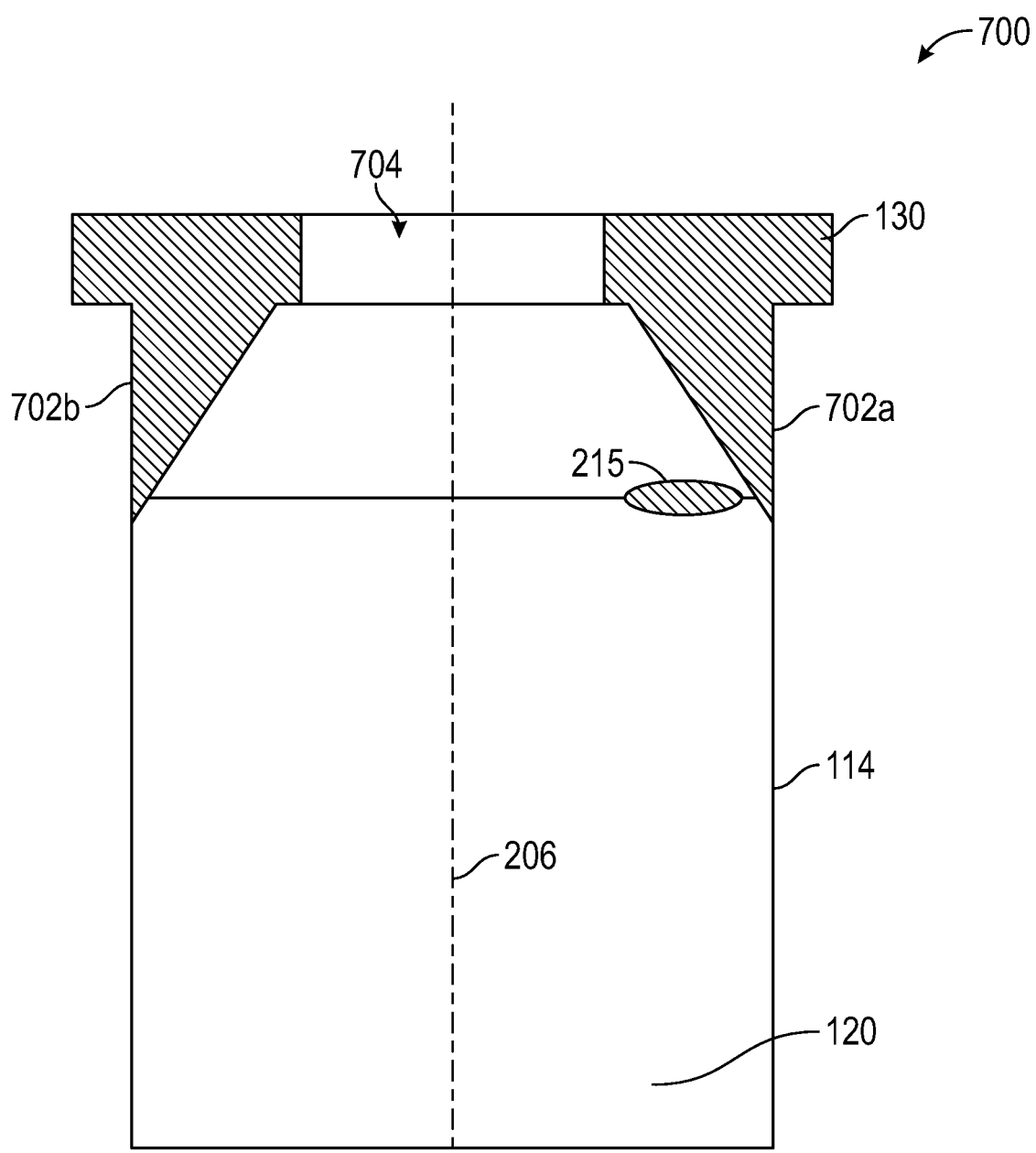
FIG. 7 shows a side view of the crucible 114 with a lid.

FIG. 6 shows a side view 600 of the crucible of FIG. 5 during a formation of a boule 602. Due to the configuration of the baffles 402a, 420b, the cold spot 215 is to one side of the central axis, as shown in FIG. 6. The rod 124 (and seed crystal) can be lowered into the crucible 114 at a location that is eccentric from the central axis 206 of the crucible 114 and away from the cold spot 215. In another embodiment, a central axis of the rod 124 (and seed crystal) can be aligned with the central axis of the crucible 114. The eccentric location of the cold spot 215 (away from the center) will ensure FIG. 7 shows a side view 700 of the crucible 114 with the lid 130. The lid 130 includes a thermal element such as baffles 702a, 702b extending downward from a bottom surface of the lid 130 and into the crucible 114 and the melt 120. The baffles 702a, 702b are diametrically opposite from each other and have a radially inward projection extending inward from an outer edge of the lid 130. Similar to the baffles 402a, 402b of FIGS. 4 and 5, the size, shape and material of the baffles 702a, 702b can be different. The radially inward projection of the baffles 702a, 720b can create a thermal gradient in the melt 120, thereby causing the cold spot 215 of the melt 120 to move away from a central axis 206 of the crucible 114.

Although the present invention has been described in considerable detail with reference to certain preferred versions thereof, other versions are possible. Therefore, the spirit and scope of the appended claims should not be limited to the description of the preferred versions contained herein.

The reader's attention is directed to all papers and documents which are filed concurrently with this specification, and which are open to public inspection with this specification, and the contents of all such papers and documents are incorporated herein by reference.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Any element in a claim that does not explicitly state "means for" performing a specified function, or "step for" performing a specific function, is not to be interpreted as a "means" or "step" clause as specified in 35 U.S.C § 112, sixth paragraph. In particular, the use of "step of" in the claims herein is not intended to invoke the provisions of 35 U.S.C § 112, sixth paragraph.

What is claimed is:

1. A furnace for growing a crystal, comprising:
   a crucible having a melt therein, the crucible having right cylindrical inner surface;
   a first baffle projecting radially inward from the right cylindrical inner surface at a first location and a second baffle projecting radially inward from the inner surface at a second location diametrically opposite the first baffle, wherein an amount by which the first baffle and the second baffle project radially inward from the right cylindrical inner surface is greatest at a bottom of the crucible and decreases with height to be flush with the right cylindrical inner surface at a top of the crucible, wherein a first transverse cross-section of the first baffle is different from a second transverse cross-section of the second baffle;

a heating element for generating heat in the melt; and a rod for drawing the crystal from the melt at a seed location to grow the crystal.

2. The furnace of claim 1, further comprising a thermal element, wherein the thermal element includes at least one fin extending from an outer surface of the crucible.

3. The furnace of claim 2, wherein the at least one fin includes a first fin having a first thermal resistance at a first location of the outer surface and a second fin having a second thermal resistance at a second location of the outer surface.

4. The furnace of claim 1, further comprising a thermal element, wherein the thermal clement comprises at least one gusset extending inward from a thermal filler surrounding the crucible.

5. The furnace of claim 4, wherein the at least one gusset includes a first gusset having a first thermal resistance at a first location of the thermal filler and a second gusset having a second thermal resistance at a second location of the thermal filler.

6. The furnace of claim 1, wherein the first baffle causes greater heating in the melt than the second baffle.

7. The furnace of claim 1, further comprising a thermal element, wherein the thermal clement comprises a lid to the crucible having a first baffle and a second baffle extending from the lid into the melt.

* * * * *